United States Patent
Maaskant et al.

(10) Patent No.: US 6,489,839 B2
(45) Date of Patent: Dec. 3, 2002

(54) AMPLIFIER WITH OUTPUT TRANSFORMER

(76) Inventors: Rob Maaskant, Schaluinen 11B, 5111 HB Baarle-Nassau (NL); Cornelis Petrus Nuijten, Kapittelweg 10, 4827 HG Breda (NL)

(*) Notice: Subject to any disclaimer, the term of this patent is extended or adjusted under 35 U.S.C. 154(b) by 0 days.

(21) Appl. No.: 09/888,460

(22) Filed: Jun. 25, 2001

(65) Prior Publication Data

US 2002/0014917 A1 Feb. 7, 2002

(30) Foreign Application Priority Data

Jun. 30, 2000 (EP) .............................................. 00202281

(51) Int. Cl.[7] ................................................. H03F 3/38

(52) U.S. Cl. ....................... 330/10; 330/207 A; 330/262

(58) Field of Search ................................. 330/262, 276, 330/10, 207 A, 251

(56) References Cited

U.S. PATENT DOCUMENTS

| | | | | |
|---|---|---|---|---|
| 3,825,846 A | * | 7/1974 | Grygera | 330/10 |
| 4,028,633 A | | 6/1977 | Rogers et al. | 330/118 |
| 4,244,015 A | * | 1/1981 | Beebe | 363/8 |
| 4,477,867 A | * | 10/1984 | Pellegrino | 363/26 |
| 4,725,937 A | * | 2/1988 | Kenny et al. | 363/26 |
| 4,827,391 A | * | 5/1989 | Sills | 363/41 |
| 5,113,333 A | * | 5/1992 | Ou | 363/25 |
| 5,115,205 A | | 5/1992 | Holmes, Jr. | 330/10 |
| 6,392,476 B1 | * | 5/2002 | Rodriguez | 330/10 |

* cited by examiner

Primary Examiner—Tuan T. Lam
(74) Attorney, Agent, or Firm—Edward W. Goodman

(57) ABSTRACT

An amplifier for use in, for example, Public Address Systems to send audio signals over long distances, is of the push-pull type and includes a first and a second switch and an output transformer having a primary winding coupled to the switches and a secondary winding coupled to the output of the push-pull amplifier. The output transformer further includes a further secondary winding coupled to a comparator as a feedback loop.

4 Claims, 1 Drawing Sheet

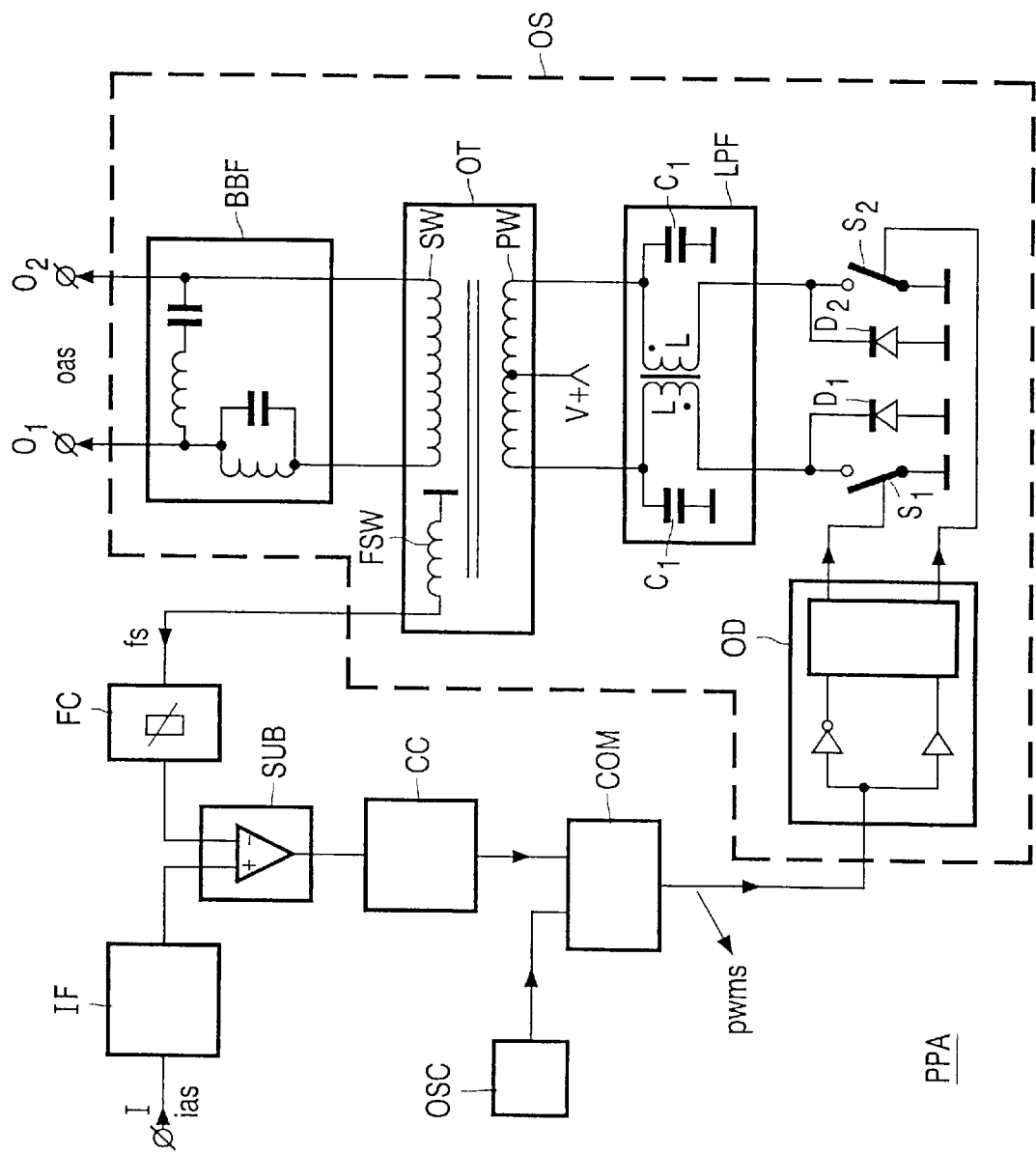

AMPLIFIER WITH OUTPUT TRANSFORMER

BACKGROUND OF THE INVENTION

1. Field of the Invention

The invention relates to an amplifier with an output transformer. The invention further relates to an output stage for use in such an amplifier. The invention further relates to a public address system comprising such an amplifier.

2. Description of the Related Art

Amplifiers are known in the art and are, for example, used as so-called PA amplifiers (Public Address amplifiers) in a Public Address System to send audio signals over long distances, for several different uses, such as, fire indicating installations, call installations, etc.

Such a system receives an audio signal at an input, and the PA amplifier supplies, via an output transformer, an audio signal with, for example, an output voltage of 100 $V_{rms}$ over long distances to speakers having input transformers.

The known amplifier use a so-called H-bridge or Half H-bridge with four or two FETs, respectively.

A disadvantage of these known amplifiers is that the efficiency is less than 70%. A further disadvantage of these known amplifiers is that the output behavior in relation to noise is not good.

SUMMARY OF THE INVENTION

An object of the invention is to provide an amplifier not having the disadvantages of the prior art amplifiers. To this end an amplifier according to the invention comprises an input for receiving an input signal, an output for supplying an output signal, a comparator for converting the input signal into a pulse-width modulated signal, and a push-pull output stage comprising a first and a second switch and an output transformer having a primary winding coupled to the switches and a secondary winding coupled to the output of the push-pull amplifier, the output transformer further comprising a further secondary winding coupled to the comparator as a feedback loop.

The amplifier according to the invention is of the so-called push-pull type. Further, the amplifier comprises an output transformer, which is required in many Public Address Systems because the user requires a galvanic separation.

An extra secondary winding is used as a feedback connection.

In this way, a push-pull amplifier is obtained having a much higher efficiency than the prior art amplifiers, and uses a feedback loop for obtaining a stable amplifier.

BRIEF DESCRIPTION OF THE DRAWING

These and other aspects of the invention will be apparent from and elucidated with reference to the accompanying drawing, in which:

The FIGURE shows a schematic block diagram of a push-pull amplifier according to the invention.

DESCRIPTION OF THE PREFERRED EMBODIMENTS

The FIGURE shows, block schematically, an example of a push-pull amplifier PPA according to the invention.

Push-pull amplifiers are, for example, used as so-called PA amplifiers (Public Address amplifiers) in a Public Address System to send audio signals over long distances, for several different uses, such as, fire indicating installations, call installations, etc. Such a system receives an audio signal at an input, and the PA amplifier supplies, via an output transformer, an audio signal with, for example, an output voltage of 100 $V_{rms}$ over long distances to loudspeakers, each having an input transformer.

The push-pull amplifier PPA receives an audio signal ias at an input I. After filtering in an input filter IF, the signal is supplied to an input of a subtractor SUB.

The output of the subtractor SUB is coupled via a control circuit CC to a first input of a comparator COM which receives, at a second input, a signal from a triangle oscillator OSC.

The comparator COM supplies a pulse-width modulated signal pwms. The output of the comparator COM is coupled to an output stage OS comprising an output driver OD for supplying drive signals to switches S1 and S2. Diodes D1 and D2 are arranged in parallel with the switches S1 and S2, respectively.

Each switch S1 and S2 is, in this example, coupled to separate windings L of a low-pass filter LPF. The low-pass filter LPS further comprises, in this example, capacitors C1 respectively coupled to each of the windings L.

The connection points of each winding L and capacitor C1 are coupled to an output transformer OT, whereby the connection points are coupled to opposite ends of a primary winding PW. The middle of the primary winding PW is coupled to a positive voltage V+.

A secondary winding SW of the output transformer OT is coupled, via a band-block filter BBF, to the first and second outputs O1 and O2, respectively, of the push-pull amplifier PPA, for supplying an output audio signal to loudspeakers (not shown).

The output transformer OT further comprises a feedback secondary winding FSW for supplying a feedback signal fs via a feedback control FC to the other input of the subtractor SUB.

The output stage comprises, in this example, the output driver OD, the switches S1 and S2, the low-pass filter LPF, the output transformer OT, and the band-block filter BBF.

The low-pass filter LPF coupled between the switches S1, S2 and the output transformer OT improves the efficiency of the push-pull amplifier even further.

The band-block filter BBF between the output transformer OT and the outputs of the push-pull amplifier O1, O2 improves the output behavior of the push-pull amplifier.

The input filter IF of the push-pull amplifier improves the characteristics of the push-pull amplifier.

It is to be understood that the push-pull amplifier according to the invention has been described above on the basis of one example, but that one skilled in the art would be well aware of a lot of other implementations within the scope of the invention.

For example, the low-pass filter can be amended. Further the band-block filter can be changed from the shown example, but resulting in the same or corresponding results.

The push-pull amplifier according to the invention can also be used in other applications than the Public Address System.

The output stage OT can also be used in combination with other push-pull amplifiers than the one described above.

What is claimed is:

1. A push-pull amplifier comprising:

an input for receiving an input signal;

an output for supplying an output signal;

a comparator for converting the input signal into a pulse-width modulated signal; and a push-pull output stage, coupled to the comparator, comprising a first and a second switch, and an output transformer having a primary winding coupled to the first and second switches and a secondary winding coupled to the output of the push-pull amplifier, said output transformer further comprising a further secondary winding coupled to the comparator as a feedback loop, wherein the push-pull output stage further comprises a low-pass filter for coupling the first and second switches to the primary winding of the output transformer.

2. The push-pull amplifier as claimed in claim 1, characterized in that the push-pull output stage further comprises a band-block filter for coupling the secondary winding of the output transformer to the output of the push-pull amplifier.

3. An output stage for use in a push-pull amplifier having an input for receiving an input signal, an output for supplying an output signal, and a comparator for converting the input signal into a pulse-width modulated signal, wherein said output stage comprises:

a first and a second switch coupled to said comparator whereby said first and second switches are controlled by said pulse-width modulated signal;

an output transformer having a primary winding coupled to said first and second switches, a secondary winding coupled to the output of the push-pull amplifier, and a further secondary winding coupled to the comparator as a feedback loop; and a low-pass filter for coupling said first and second switches to the primary winding of the output transformer.

4. A public address system comprising loudspeakers each having an input transformer and a push-pull amplifier, wherein said push-pull amplifier comprises:

an input for receiving an input signal;

an output for supplying an output signal;

a comparator for converting the input signal into a pulse-width modulated signal; and a push-pull output stage, coupled to the comparator, comprising a first and a second switch, and an output transformer having a primary winding coupled to the first and second switches and a secondary winding coupled to the output of the push-pull amplifier, said output transformer further comprising a further secondary winding coupled to the comparator as a feedback loop, and said push-pull output stage further comprising a low-pass filter for coupling said first and second switches to the primary winding of the output transformer.

* * * * *

UNITED STATES PATENT AND TRADEMARK OFFICE
CERTIFICATE OF CORRECTION

PATENT NO. : 6,489,839 B2  
DATED : December 3, 2002  
INVENTOR(S) : Rob Maaskant and Cornelis Petrus Nuijten It is certified that error appears in the above-identified patent and that said Letters Patent is hereby corrected as shown below:

<u>Title page,</u>  
Insert:

-- [73] Assignee: Koninklijke Philips Electronics N.V., Eindhoven (NL) --.

Signed and Sealed this

Twenty-seventh Day of May, 2003

JAMES E. ROGAN  
*Director of the United States Patent and Trademark Office*